United States Patent [19]

Ishikiriyama

[11] Patent Number: 5,479,038
[45] Date of Patent: Dec. 26, 1995

[54] SEMICONDUCTOR DEVICE HAVING A MULTILEVEL METALLIZATION

[75] Inventor: Mamoru Ishikiriyama, Tokyo, Japan

[73] Assignee: Oki Electric Industry Co., Ltd., Tokyo, Japan

[21] Appl. No.: 351,125

[22] Filed: Nov. 30, 1994

Related U.S. Application Data

[62] Division of Ser. No. 982,552, Nov. 27, 1992, Pat. No. 5,387,817.

[30] Foreign Application Priority Data

Dec. 2, 1991 [JP] Japan ................. 3-318132

[51] Int. Cl.[6] ........................ H01L 23/48
[52] U.S. Cl. .............. 257/353; 257/499; 257/510; 257/524; 257/776
[58] Field of Search ................. 257/770, 353, 257/524, 776, 499, 506, 510, 758

[56] References Cited

U.S. PATENT DOCUMENTS 4,361,846 11/1982 Tsukuda ................... 257/525
5,057,895 10/1991 Beasom ................... 257/524

FOREIGN PATENT DOCUMENTS 5315621 11/1993 Japan.

Primary Examiner—William Mintel
Assistant Examiner—Roy Potter
Attorney, Agent, or Firm—Spencer, Frnak & Schneider

[57] ABSTRACT

Upper and lower metallizations are formed on a semiconductor substrate so as to prevent the upper metallization from being inferior wherein the semiconductor substrate includes a plurality of element forming regions, a plurality of isolation insulating regions for surrounding said element forming regions, and a supporter region extending between the isolation insulating regions. The lower metallization is formed on the supporter region and the upper metallization is formed to extend from one element forming region to another element forming regions while striding over the lower metallization not to cross the region where the lower metallization adjoins the isolation insulating regions. The lower metallization may be formed from one element forming region to another element forming regions while the upper metallization is formed to stride over the lower metallization.

4 Claims, 10 Drawing Sheets

SEMICONDUCTOR DEVICE HAVING A MULTILEVEL METALLIZATION

This is a Division of application Ser. No. 07/982,552 filed Nov. 27, 1992, allowed Aug. 4, 1994 now U.S. Pat. No. 5,387,817.

BACKGROUND OF THE INVENTION

1. Field of the Invention

The present invention relates to a semiconductor device having a multilevel metallization, and more particularly to a multilevel metallization structure thereof.

2. Description of the Related Art

There has been employed in recent years a multilevel metallization technology adapted for enhancing high integration of a semiconductor integrated circuit such as an IC, an LSI, etc.

A multilevel metallization structure formed on a conventional dielectric isolation substrate is disclosed, for example, in Japanese Patent Laid-Open Publication No. 57-45242. The isolation insulating film region on the dielectric isolation substrate is inevitably recessed in a fabrication process, as described later in detail. In the multilevel metallization structure, a lower metallization is frequently formed adjacent to the isolation insulating film region. Accordingly, there is formed a step height of which is the sum of the depth of the recess and the thickness of the lower metallization. In the multilevel metallization structure formed on the conventional dielectric isolation substrate, an upper metallization made of e.g. aluminum is formed so as to cross the step. Accordingly, there occurred such a problem that the upper metallization is broken at the step. Since the upper metallization is likely to be formed thin at the end of the step, there was such a problem that the lower metallization was broken as the time elapsed because of an electromigration which caused by the increase of the density of current at the end of the step in case the upper metallization was made of aluminum.

SUMMARY OF THE INVENTION

It is an object of the present invention to provide a semiconductor device capable of eliminating the breaking of the upper metallization, of reducing the occurrence of the inferior metallization due to the electromigration which are respectively set forth above, and of improving an yield and a performance thereof.

The semiconductor device having a multilevel metallization according to a first aspect of the present invention comprises a semiconductor substrate having a main surface, said main surface comprising, first, second, third and fourth element forming regions, first, second, third and fourth isolation insulating film regions which respectively surround the first, second, third and fourth element forming regions, a first supporter region extending in a first direction between the first isolation insulating film region and the second isolation insulating film region and between the third isolation insulating film region and the fourth isolation insulating film region and a second supporter region extending in a second direction which crosses the first direction at right angles between the first isolation insulating film region and the third isolation insulating film region and between the second isolation insulating film region and the fourth isolation insulating film region wherein the second supporter region has a crossing region which crosses the first supporter region, a lower metallization which is formed over the semiconductor substrate and extends on the first supporter region, and an upper metallization which is formed over the semiconductor substrate and extends from the first element forming region to the second supporter region between the first and third element forming regions and further extends over the lower metallization over the crossing region along the second supporter region.

A semiconductor device having a multilevel metallization according to a second aspect of the present invention comprises a semiconductor substrate having a main surface, said main surface comprising first and second element forming regions, first and second isolation insulating film regions which respectively surround the first and second element forming regions, a supporter region extending between the first isolation insulating film region and the second isolation insulating film region, a lower metallization which is formed on the semiconductor substrate and extends from the first element forming region to the supporter region and further extends to the second element forming region, and an upper metallization which is formed over the semiconductor substrate and extends over the lower metallization on the supporter region.

DESCRIPTION OF THE PREFERRED EMBODIMENT

Figure 1A:
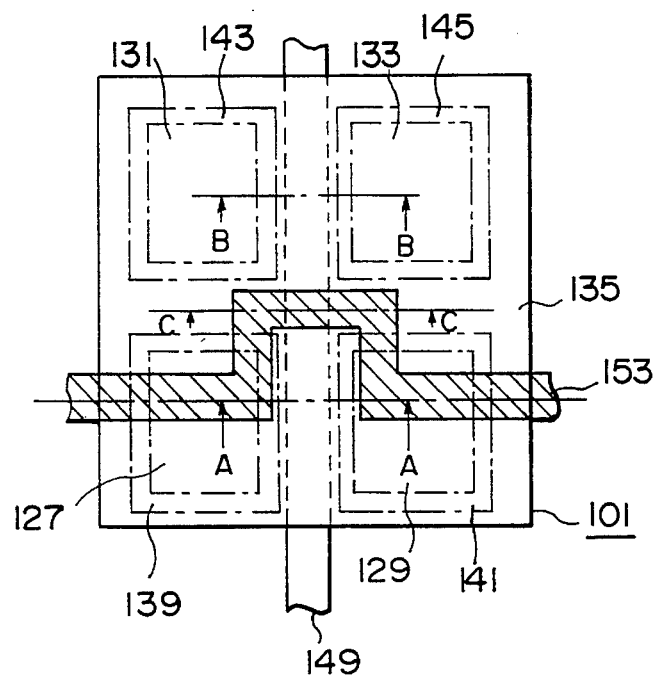
FIG. 1A is a plan view of a semiconductor device having a multilevel metallization structure according to a first embodiment of the present invention.
Figures 1B, 1C:
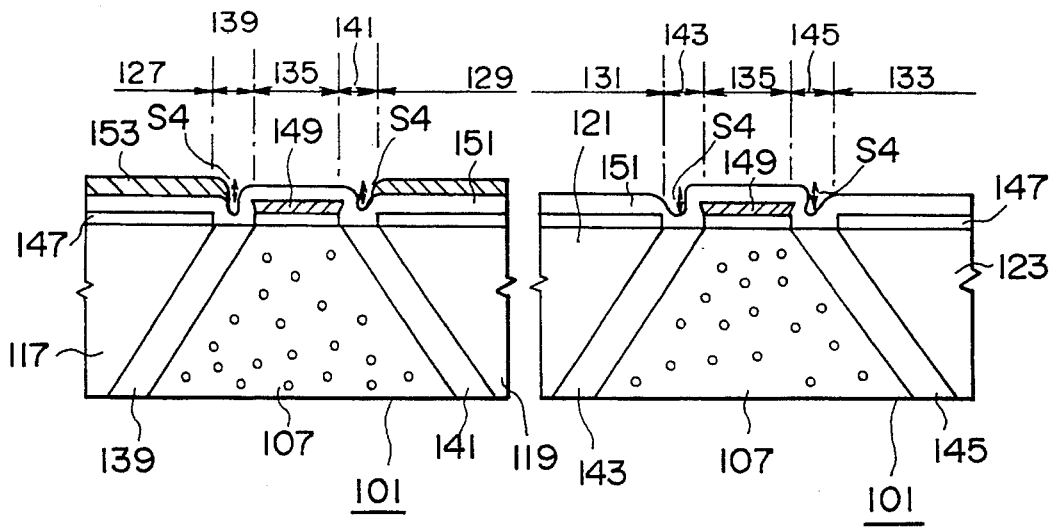
FIG. 1B is a cross-sectional view taken along the line A—A of FIG. 1A.
FIG. 1C is a cross-sectional view taken along the line B—B of FIG. 1A.
Figure 1D:
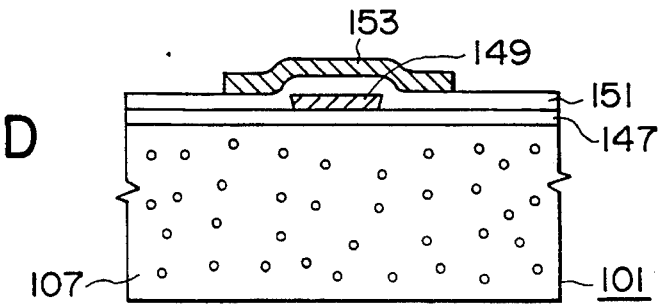
FIG. 1D is a cross-sectional view taken along the line C—C of FIG. 1A.

First Embodiment (FIGS. 1A to 1M):

A multilevel metallization according to a first embodiment will be described with reference to FIGS. 1A to 1M. FIG. 1A is a plan view of a semiconductor device having a multilevel metallization structure according to a first embodiment of the present invention. FIGS. 1B, 1C and 1D are respectively cross-sectional views taken along the lines A—A, B—B and C—C of FIG. 1A.

A dielectric isolation substrate 101 in FIG. 1B comprises single-crystal silicons 117 and 119, isolation insulating films 109 and 111 and a supporter layer 107. A forming process of the dielectric isolation substrate 101 will be described with reference to the cross-sectional views of FIGS. 6A to 6E.

Figure 6A:
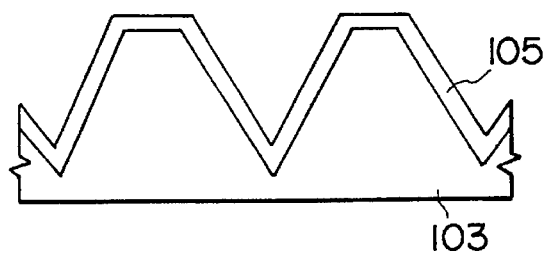
FIG. 6A is a cross-sectional view showing a first stage of fabrication process of a dielectric isolation substrate.
Figure 6B:
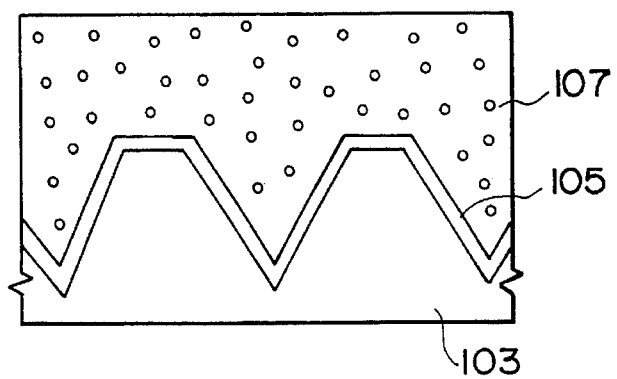
FIG. 6B is a cross-sectional view showing a second stage of fabrication process of a dielectric isolation substrate.
Figure 6C:
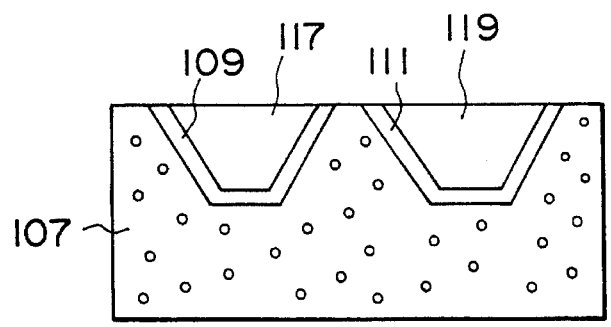
FIG. 6C is a cross-sectional view showing a third stage of fabrication process of a dielectric isolation substrate.

As illustrated in FIG. 6A, a single-crystal silicon 103 is subjected to etching to thereby form a V-groove on the single-crystal silicon 103 and thereafter an isolation insulating film 105 is formed on the single-crystal silicon 103. Thereafter, a supporter layer 107 made of polysilicon is formed on the isolation insulating film 105 (FIG. 6B). Successively, the single-crystal silicon 103 is subjected to polishing until a part of the supporter layer 107 is exposed (FIG. 6C). The single-crystal silicon 103 is divided into two single-crystal silicons 117 and 119. Two isolation insulating films 109 and 111 are isolated from the isolation insulating film 105.

Figure 6D:
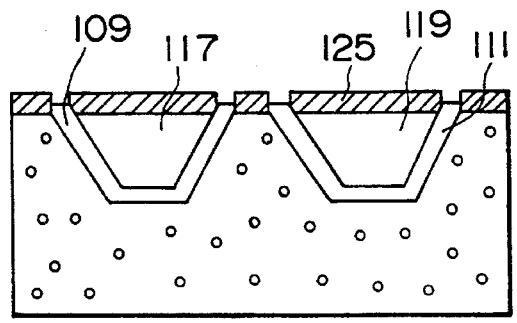
FIG. 6D is a cross-sectional view showing a fourth stage of fabrication process of a dielectric isolation substrate.
Figure 6E:
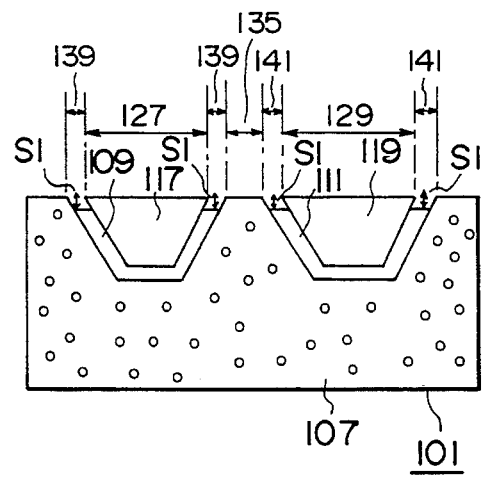
FIG. 6E is a cross-sectional view taken along the line A—A of FIG. 6F.

Successively, a thermal oxide film 125 is formed by thermal oxidation. At this time, the thermal oxide film 125 does not grow on the exposed portions of the isolation insulating films 109 and 111 (FIG. 6D). The thermal oxide film 125 is subjected to the etching and is eliminated thereafter. At the etching process, the isolation insulating films 109 and 111 are also subjected to the etching in the same way as the thermal oxide film 125. Accordingly, the exposed portions of the isolation insulating films 109 and 111 are recessed (FIG. 6E). The depth of each recess, namely, first step S1 which is formed between the exposed surface of the supporter layer 107 and the exposed surfaces of the single-crystal silicons 117 and 119 and those of the isolation insulating films 109 and 111, is about 1 μm. The formation and the elimination of the thermal oxide film are performed several times in the forming process of the dielectric isolation substrate 101 in order to purify the surface of the dielectric isolation substrate 101 and for other purposes. Accordingly, the exposed portions of the isolating insulating films on the surface of the dielectric isolation substrate are recessed.

Figure 6F:
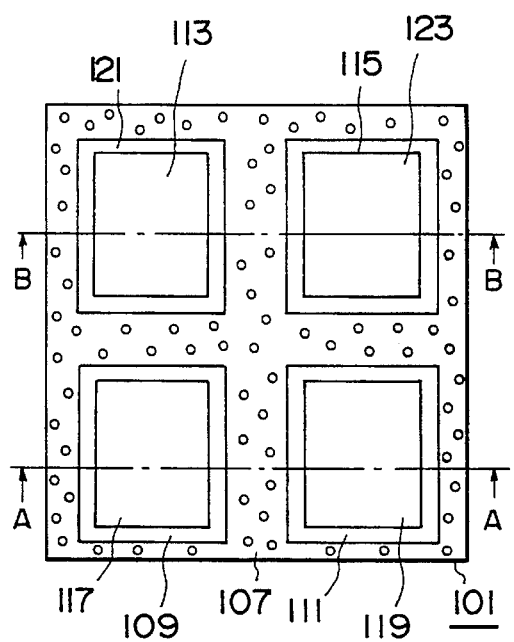
FIG. 6F is a cross-sectional view of a dielectric isolation substrate.
Figure 6G:
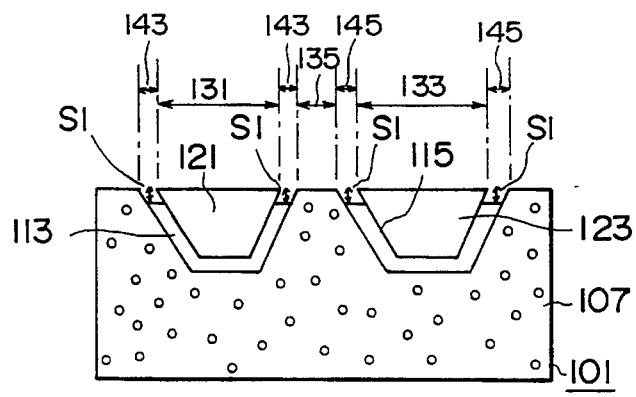
FIG. 6G is a cross-sectional view taken along the line B—B of FIG. 6F.

FIG. 6F is a plan view of the dielectric isolation substrate 101. The cross-sectional view taken along the line A—A of FIG. 6F corresponds to FIG. 6E. Denoted at 121 and 123 in FIG. 6F are single-crystal silicons and 113 and 115 are isolation insulating films. These single-crystal silicons 121 and 123 and the isolation insulating films 113 and 115 are respectively formed in the same way as the single-crystal silicons 117 and 119 and the isolation insulating films 109 and 111. FIG. 6G is a cross-sectional view taken along the line B—B of FIG. 6F. As explained above, the dielectric isolation substrate 101 is structured in such a manner that a plurality of islands of the single-crystal silicons 117, 119, 121 and 123 float in the sea of the supporter layer 107 and are respectively isolated by the isolation insulating films 109, 111, 113 and 115.

The single-crystal silicons 117, 119, 121 and 123 in FIG. 6F are defined as first, second, third and fourth single-crystal silicons. The isolation insulating films 109, 111, 113 and 115 in FIG. 6F are defined as first, second, third and fourth isolation insulating films. Exposed regions of the first, second, third and fourth single-crystal silicons 117, 119, 121 and 123 as illustrated in FIGS. 6E and 6G are defined as first, second, third and fourth element forming regions 127, 129, 131 and 133. Exposed regions of the first, second, third and fourth isolation insulating films 109, 111, 113 and 115 are defined as first, second, third and fourth isolation insulating film regions 139, 141, 143 and 145. An exposed region of the supporter layer 107 is defined as a supporter region 135. These element forming regions, isolation insulating film regions and the supporter region also represent regions on films or metallizations which are successively formed on each exposed region, described later.

Figure 1E:
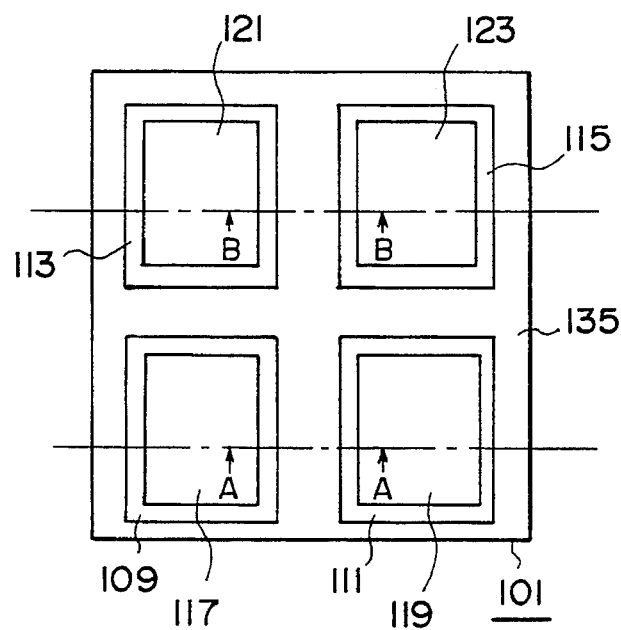
FIG. 1E is a plan view showing a first fabrication process of the semiconductor device having a multilevel metallization structure according to the first embodiment of the present invention.
Figures 1F, 1G:
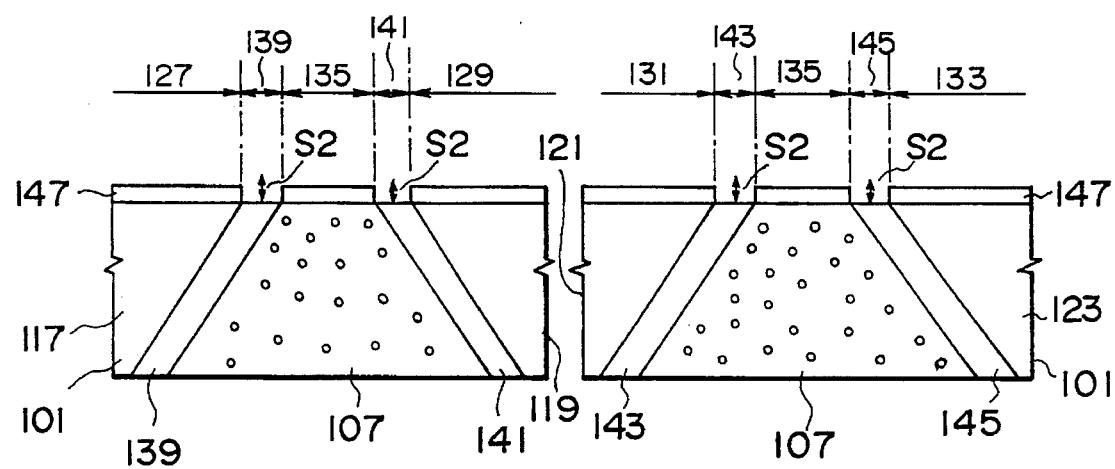
FIG. 1F is a cross-sectional view taken along the line A—A of FIG. 1E.
FIG. 1G is a cross-sectional view taken along the line B—B of FIG. 1E.

The thus formed metallization structure on the dielectric isolation substrate 101 will be described more in detail with reference to FIGS. 1A to 1M. FIG. 1E is a plan view showing a fabrication process of a semiconductor device according to the first embodiment of the present invention. FIG. 1F and 1G are cross-sectional views taken along the line A—A and line B—B of FIG. 1E.

As illustrated in FIG. 1F and 1G, field oxide films 147 are formed by thermal oxidation on the supporter region 135 and the first, second, third and fourth element forming regions 127, 129, 131 and 133 on the dielectric isolation substrate 101. At that time, the field oxide films 147 are not formed on the exposed portions of the first, second, third and fourth isolation insulating film regions 139, 141, 143 and 145. Accordingly, there are formed second steps S2 between the exposed portions of the first to fourth isolation insulating films 139, 141, 143 and 145 and the first to fourth element forming regions 127, 129, 131 and 133 and the supporting region 135 on the surface of the field oxide film 147. The depth of the steps S2 are greater that those of the first steps S1.

Thereafter, the field oxide films 147 on the first, second, third and fourth element forming regions 127, 129, 131 and 133 are partially eliminated so that the semiconductor device is fabricated. However, the explanation of the semiconductor elements is omitted since there are many cases that the semiconductor device is not formed on regions where an upper metallization is formed, described later.

Figure 1H:
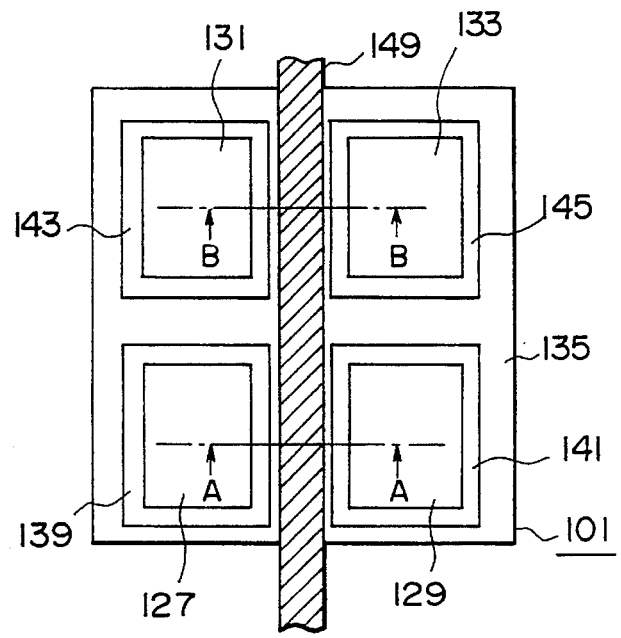
FIG. 1H is a plan view showing a second fabrication process of the semiconductor device having a multilevel metallization structure according to the first embodiment of the present invention.
Figures 1I, 1J:
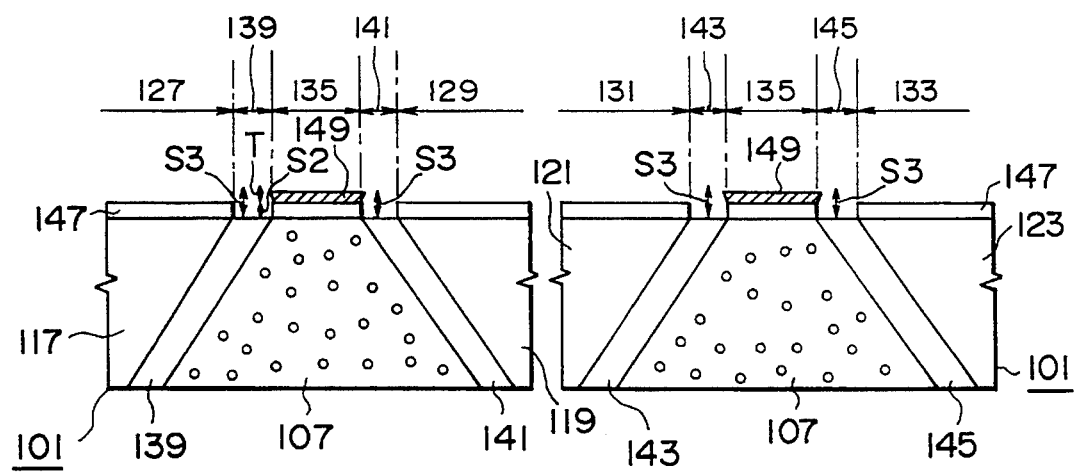
FIG. 1I is a cross-sectional view taken along the line A—A of FIG. 1H.
FIG. 1J is a cross-sectional view taken along the line B—B of FIG. 1H.
Figure 1K:
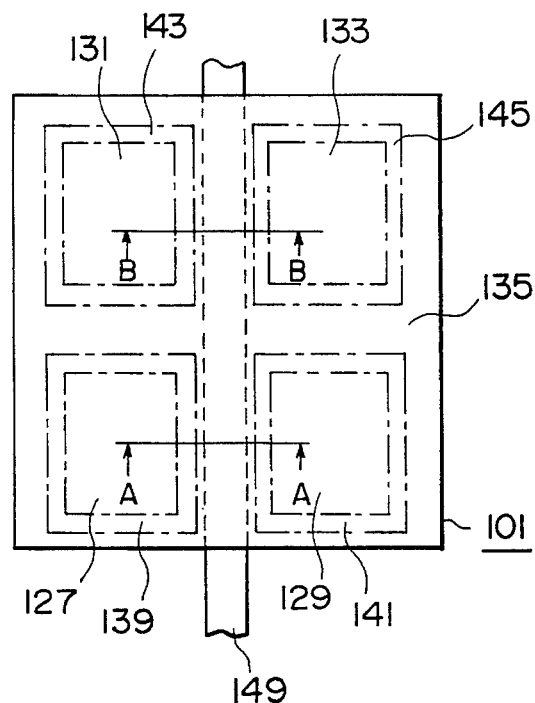
FIG. 1K is a plan view showing a third fabrication process of the semiconductor device having a multilevel metallization structure according to the first embodiment of the present invention.

Successively, a lower metallization 149 is formed on the field oxide film 147 which is formed on the supporter region 135 (FIG. 1I, FIG. 1J). In the first embodiment, the lower metallization 149 is formed on the supporter region 135 between the first and second element forming regions 127 and 129 and between the third and fourth element forming regions 131 and 133 (FIG. 1H).

As described above, the lower metallization 149 is frequently formed on the supporter region 135. The width W of the supporter region 135 is as small as possible in order to enhance the high integration of the semiconductor element. However, the width of the supporter region 135 ranges from several μm to ten and several μm due to the dispersion of accuracy of polishing. Accordingly, there is a case that the lower metallization 149 is formed adjacent to the first, second, third and fourth isolation insulating film regions 139, 141, 143 and 145. In this case, the lower metallization is shaped as a reverse-trapezoid in cross-section owing to the influence of the second steps S2. Furthermore, third steps S3, having the height which is the sum of the thickness T of the lower metallization 149 and the second steps S2, are formed between the surface of the lower metallization 149 and the exposed portions of the isolation insulating film regions 139, 141, 143 and 145.

Figures 1L, 1M:
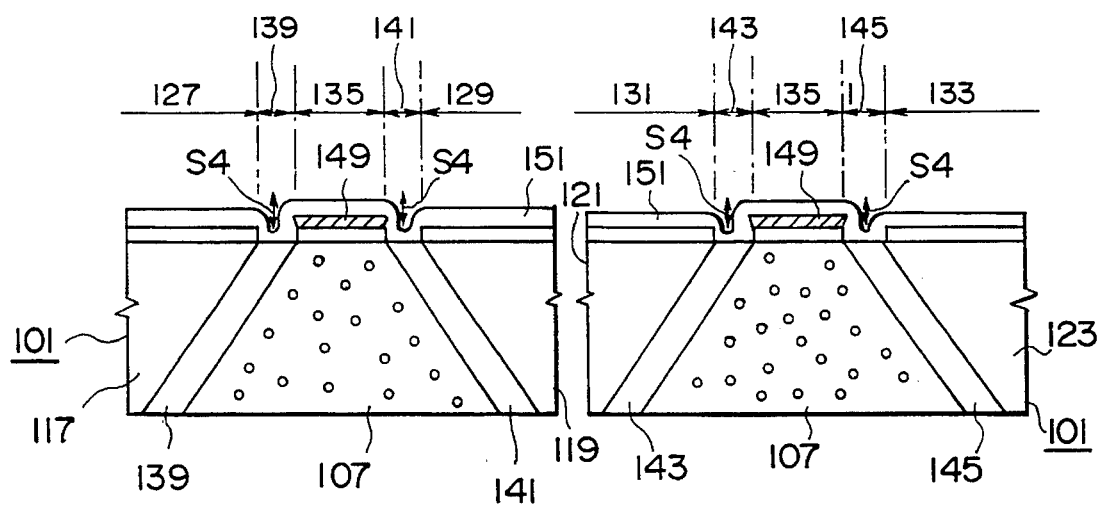
FIG. 1L is a cross-sectional view taken along the line A—A of FIG. 1K.
FIG. 1M is a cross-sectional view taken along the line B—B of FIG. 1K.

Thereafter, an interlevel insulating film 151 is formed on the lower metallization 149, the field oxide film 147 and the exposed portions of the first, second, third and fourth isolation insulating film regions 139, 141, 143 and 145 (FIG. 1L, FIG. 1M). There are formed fourth steps S4 between the surface of the interlevel insulating film on the supporter region 135 and the surfaces of the interlevel insulating films on the first, second, third and fourth isolation insulating film regions 139, 141, 143 and 145 owing to the influence of the third steps S3.

Successively, an upper metallization 153 made of, e.g. aluminum is formed on the interlevel insulating film 151 so as not to cross the step S4 as shown in FIG. 1A. That is, the upper metallization 153 is formed on the first element forming region 127 in the direction to cross the lower metallization 149 at right angles and extends to the supporter region 135 between the first and third element forming regions 127 and 131 in parallel with the lower metallization 149, then extends to the supporter region 135 between the fourth and second element forming regions 133 and 129 in the direction to cross the lower metallization 149 at right angles, and then extends to the second element forming region 129 in parallel with the lower metallization 149 and thereafter extends to the second element forming region 129 in the direction to cross the lower metallization 149 at right angles.

As shown in FIG. 1B, the upper metallization 153 is not formed on the fourth steps S4 and crosses the lower metallization 149 on the supporter region 135 (FIG. 1D)). Accordingly, the upper metallization 153 can be prevented from being broken. Furthermore, the upper metallization is prevented from being formed thin due to the influence of the steps. Accordingly, the electric migration caused by the increase of the current density is prevented from occurring. As evident from the above, it is possible to prevent the inferior metallization of the upper metallization according to the first embodiment.

Figure 2A:
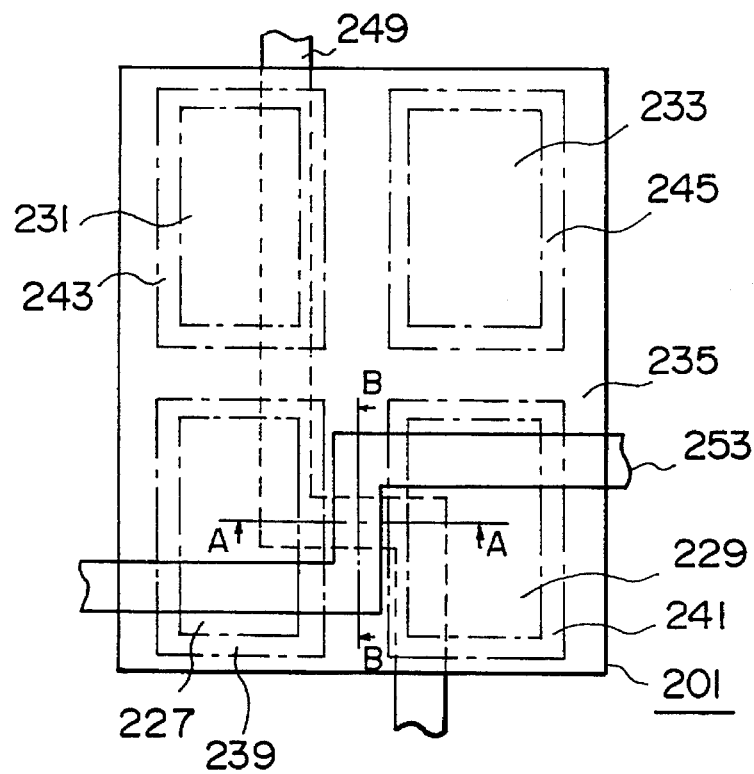
FIG. 2A is a plan view of a semiconductor device having a multilevel metallization structure according to a second embodiment of the present invention.

Second Embodiment (FIGS. 2A to 2C):

A semiconductor device having a multilevel metallization according to a second embodiment will be described with reference to FIGS. 2A to 2C. FIG. 2A is a plan view and FIGS. 2B and 2C are cross sectional views taken along the line A—A and line B—B of FIG. 2A.

Figure 2B:
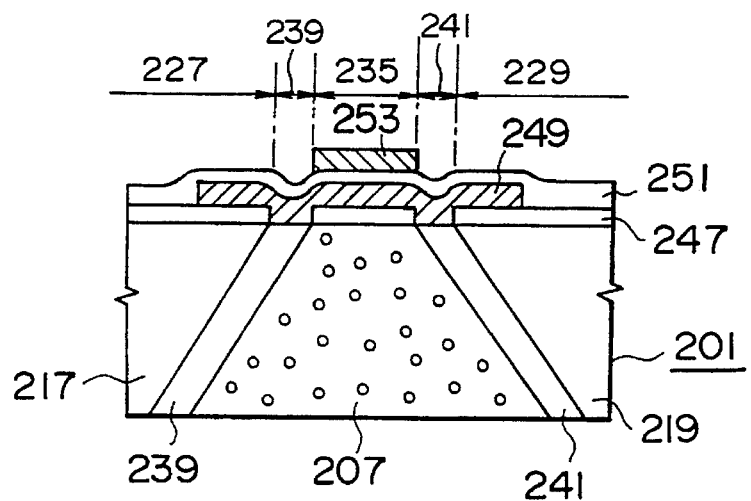
FIG. 2B is a cross-sectional view taken along the line A—A of FIG. 2A.
Figure 2C:
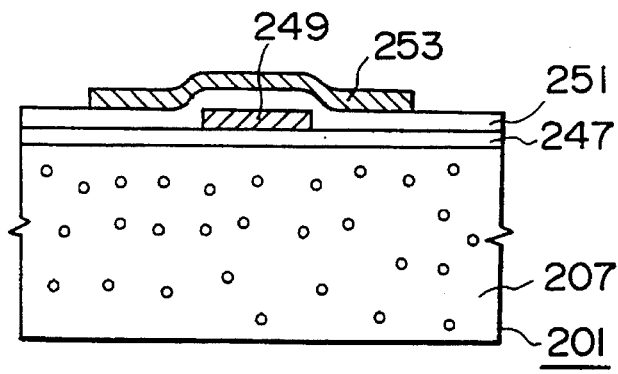
FIG. 2C is a cross-sectional view taken along the line B—B of FIG. 2A.

A dielectric isolation substrate 201 and a field insulating film 247 in FIGS. 2B and 2C are respectively formed in the same way as the first embodiment.

According to the second embodiment, a lower metallization 249 is formed on the field insulating film 247 and the exposed portions of first, second and third isolation insulating film regions 239, 241 and 243. The lower metallization 249 is formed to extend firstly in a first direction from a specific region of the third element forming region 231 to a specific region of the first element forming region 227 along the first isolation insulating film region 239 between the first element forming region 227 and the second element forming region 229, secondly in a second direction, which crosses the first direction at right angles, from the specific region of the first element forming region 227 to a specific region of the second element forming region 229, thirdly in the first directions along the second isolation insulating film 241 between the first element forming region 227 and the second element forming region 229 (FIG. 2A). In such a manner, the lower metallization 249 has a lower metallization portion which is formed to extend from the specific region of the first element forming region 227 to the specific region of the second forming region 229 in the second direction which crosses the first direction at right angles. The lower metallization portion covers the second step S2 which is explained in the first embodiment with reference to FIGS. 1B and 1C (FIG. 2B).

Successively, an interlevel insulating film 251 is formed on the lower metallization 249, the field oxide film 247 and exposed portions of the first, second, third and fourth isolation insulating film regions 239, 241, 243 and 245 in the same manner as the first embodiment (FIG. 2A).

Thereafter, an upper metallization 253 is formed on the interlevel insulating film 251. The upper metallization 253 is formed to extend firstly in the second direction from the first element forming region 227 to a specific region of a supporter region 235 between the first element forming region 227 and the second forming region 229, secondly in the first direction from the specific region of the supporter region 235 to another specific region of the same while striding over the lower metallization, and thirdly in the second direction from the another specific region of the supporter region 235 to the second element forming region 229 (FIG. 2A).

In such a manner, according to the second embodiment, the lower metallization 249 has a lower metallization portion which is formed to extend in the second direction which crosses the first directions at right angles from the specific region of the first element forming region 227 to the specific region of the second element forming region 229 while the upper metallization 253 extends to stride over the lower metallization 249. Accordingly, since the upper metallization 253 is formed over the lower metallization 249 which covers the second step S2 as illustrated in FIG. 2B, the upper metallization 253 can be prevented from being inferior in the same manner as the first embodiment.

Figure 3A:
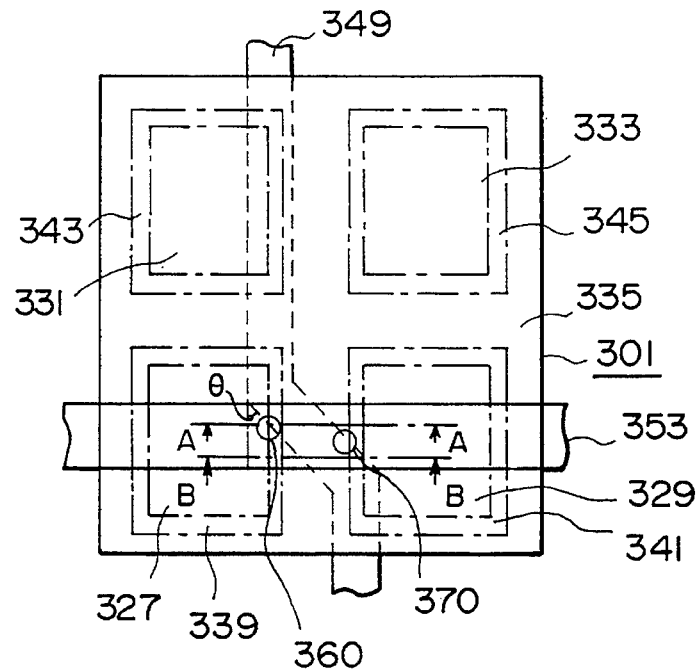
FIG. 3A is a plan view of a semiconductor device having a multilevel metallization structure according to a third embodiment of the present invention.

Third Embodiment (FIGS. 3A to 3C):

A semiconductor device having a multilevel metallization according to a third embodiment will be described with reference to FIGS. 3A to 3C. FIG. 3A is a plan view and FIGS. 3B and 3C are cross sectional views taken along the line A—A and line B—B of FIG. 3A.

Figure 3B:
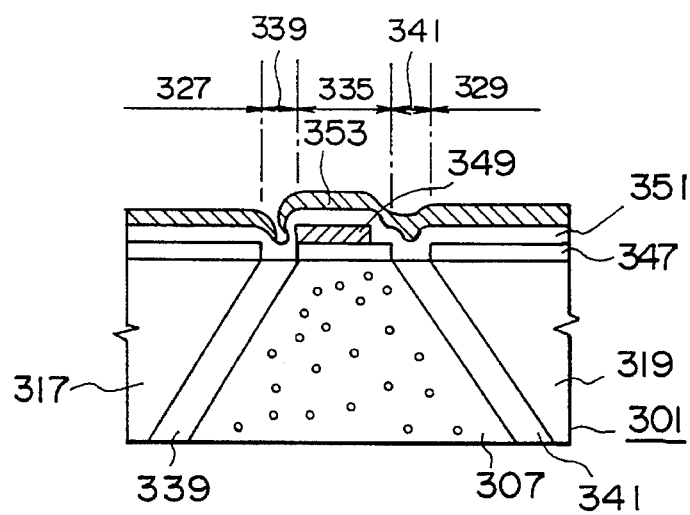
FIG. 3B is a cross-sectional view taken along the line A—A of FIG. 3A.
Figure 3C:
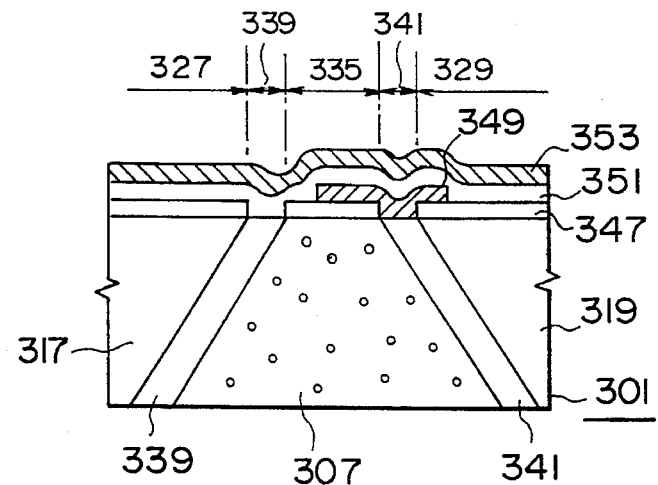
FIG. 3C is a cross-sectional view taken along the line B—B of FIG. 3A.

A dielectric isolation substrate 301 and a field insulating film 347 in FIGS. 3B and 3C are respectively formed in the same way as the first embodiment.

According to the third embodiment, a lower metallization 349 is formed on the field insulating film 347 and the exposed portions of first, second and third isolation insulating film regions 339, 341 and 343. The lower metallization 349 is formed to extend firstly in a first direction along the third isolation insulating film region 343 between a third element forming region 331 and a fourth element forming region 333 and along the first isolation insulating film region 339 between a first element forming region 327 and a second element forming region 329, secondly in a second direction which crosses at an angle θ(0°<θ<90°) to the first direction from the first isolation insulating film region 339 between the first element forming region 327 and the second element forming region 329 to the second isolation insulating film region 341 between the first element forming region 327 and the second element forming region 329, and thirdly in the first direction from the second isolation insulating film region 341 between the first element forming region 327 and the second element forming region 329 (FIG. 3A). The angle θ is preferable to be about 45°. In such a manner, the lower metallization 349 has a lower metallization portion formed to extend in the second direction which crosses at the angle θ (0°<θ<90°) to the first direction and extends from the first isolation insulating film region 339 between the first element forming region 327 and the second element forming region 329 to the second isolation insulating film region 341 between the first element forming region 327 and the second element forming region 329.

Successively, an interlevel insulating film 351 is formed on the lower metallization 349, the field oxide film 347 and the exposed portions of the first, second, third and fourth isolation insulating film regions 339, 341, 343 and 345.

The upper metallization 353 is formed to extend in a third direction which crosses at right angles the first direction at right angles from the first element forming region 327 to the second element forming region 329 while striding over the lower metallization portion.

According to the third embodiment, the lower metallization 349 is structured to have a lower metallization portion formed to extend in the second direction which crosses at the angle θ (0°<θ<90°) to the first direction from the first isolation insulating film region 339 between the first element forming region 327 and the second element forming region 329 to the second isolation insulating film region 341 between the first element forming region 327 and the second element forming region 329 and the upper metallization 353 is formed to stride over the lower metallization portion. In this case, there is a possibility that the upper metallization 353 is broken as illustrated in FIG. 3B at crossing portions 360 and 370 where the first and the second isolation insulating regions 339 and 341 cross the side surface of the lower metallization portion and the neighboring portions of the crossing portions 360 and 370. However, since the upper metallization 353 is formed on the lower metallization portion and the surface insulating film 351 which cover the second step S2 (FIGS. 1F and 1G) at the portion except the crossing portions 360 and 370, it is possible to prevent the occurrence of the electromigration if the width of the upper metallization 353 is large (FIG. 3C).

Figure 4A:
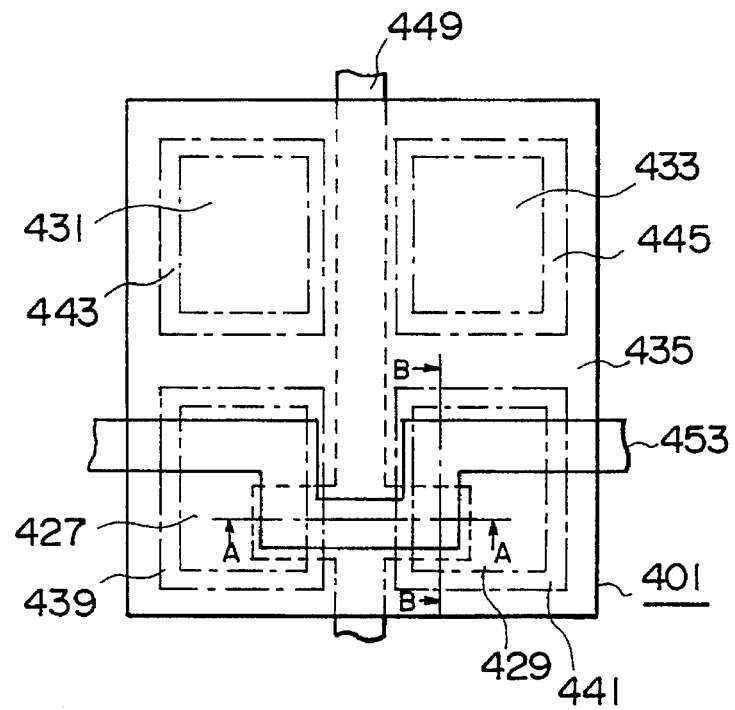
FIG. 4A is a plan view of a semiconductor device having a multilevel metallization structure according to a fourth embodiment of the present invention.

Fourth Embodiment (FIGS. 4A to 4C):

A semiconductor device having a multilevel metallization according to the fourth embodiment will be described with reference to FIGS. 4A to 4C. FIG. 4A is a plan view and FIGS. 4B and 4C are cross sectional views taken along the line A—A and line B—B of FIG. 4A.

Figure 4B:
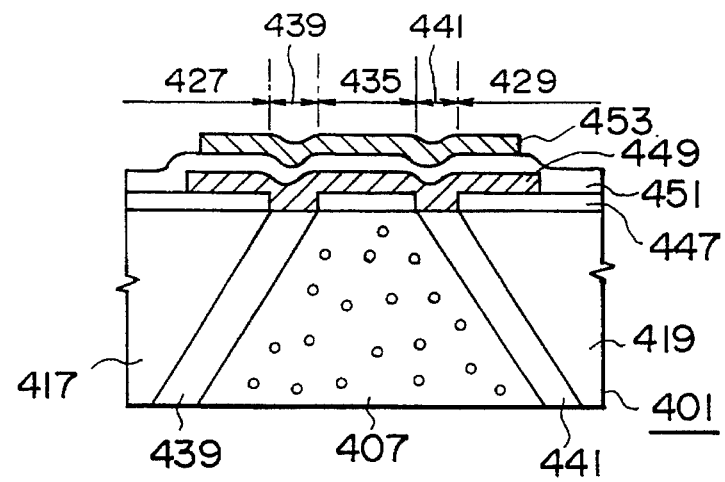
FIG. 4B is a cross-sectional view taken along the line A—A of FIG. 4A.
Figure 4C:
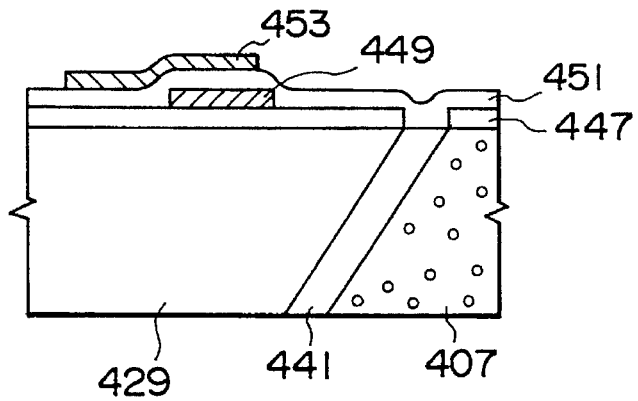
FIG. 4C is a cross-sectional view taken along the line B—B of FIG. 4A.

A dielectric isolation substrate 401 and a field insulating film 447 in FIGS. 4B and 4C are respectively formed in the same way as the first embodiment.

According to the fourth embodiment, a lower metallization 449 is formed on the field insulating film 447 and the exposed portions of first and second isolation insulating film regions 439 and 441 (FIG. 4B). The lower metallization 449 includes a lower metallization portion which is formed on a supporter region 435 between a first element forming region 427 and a second element forming region 429 and extends in the first direction, a first wide portion which extends in the second direction which crosses the first direction at right angles on the first isolation insulating film region 439 between the first element forming region 427 and the second element forming region 429 and on the first element forming region 427 and a second wide portion which extends in the second direction on the second isolation insulating film region 441 between the first element forming region 427 and the second element forming region 429 and on the second element forming region 429 (FIG. 4A).

Successively an interlevel insulating film 451 is formed on the lower metallization 449, a field oxide film 447 and the exposed portions of the first, second, third and fourth isolation insulating film regions 439, 441, 443 and 445 in the same way as the first embodiment.

The upper metallization 453 is formed on the interlevel insulating film 451. The upper metallization 453 is firstly formed on the first element forming region 427 in the second direction, secondly, extends in the first direction to the first wide portion, thirdly extends in the second direction to the second wide portion, fourthly extends in the first direction to the specific region of the second element forming region 429 and fifthly extends in the second direction from the specific region of the second forming region 429 (FIG. 4A).

According to the fourth embodiment, the lower metallization 449 is structured to have a lower metallization portion which extends in the second direction which crosses the first direction at right angles on the first isolation insulating film region 439 between the first element forming region 427 and the second element forming region 429 and on the first element forming region 427 and a second wide portion which extends in the second direction to the second isolation insulating film region 441 between the first element forming region 427 and the second element forming region 429 and on the second element forming region 429 and the upper metallization 453 is structured to stride over the first and second wide portions. In such a manner, the upper metallization 453 is formed on the first and second wide portions (FIG. 4B) which cover the second steps S2 (FIGS. 1F and 1G). Accordingly, an inferior metallization of the upper metallization 453 can be prevented from being inferior.

Figure 5A:
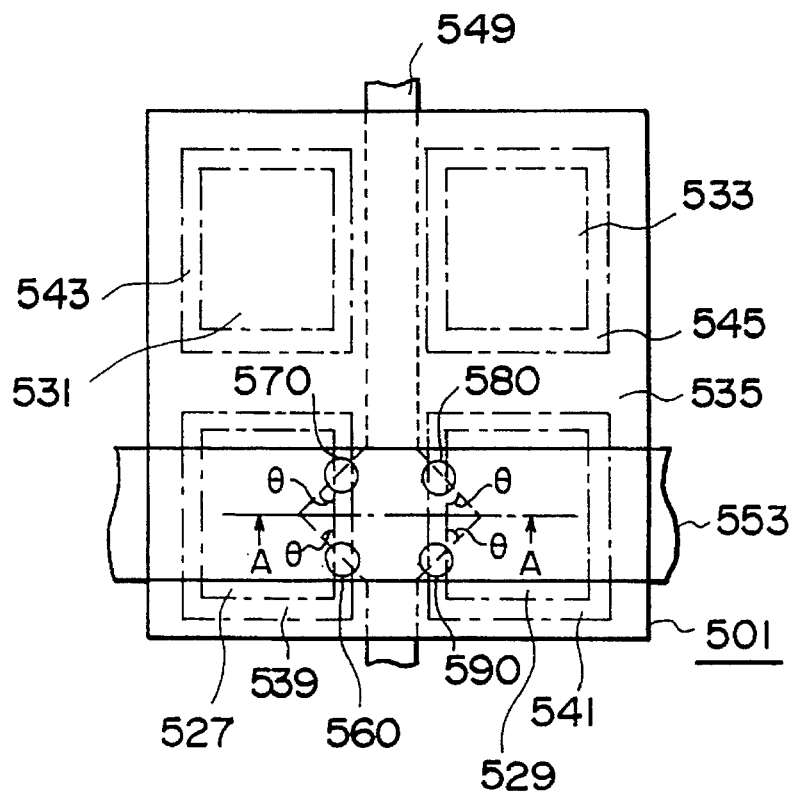
FIG. 5A is a plan view of a semiconductor device having a multilevel metallization structure according to a fifth embodiment of the present invention.

Fifth Embodiment (FIGS. 5A to 5C):

A semiconductor device having a multilevel metallization according to the fifth embodiment will be described with reference to FIGS. 5A to 5C. FIG. 5A is a plan view and FIGS. 5B and 5C are cross sectional views taken along the line A—A and line B—B of FIG. 5A.

Figure 5B:
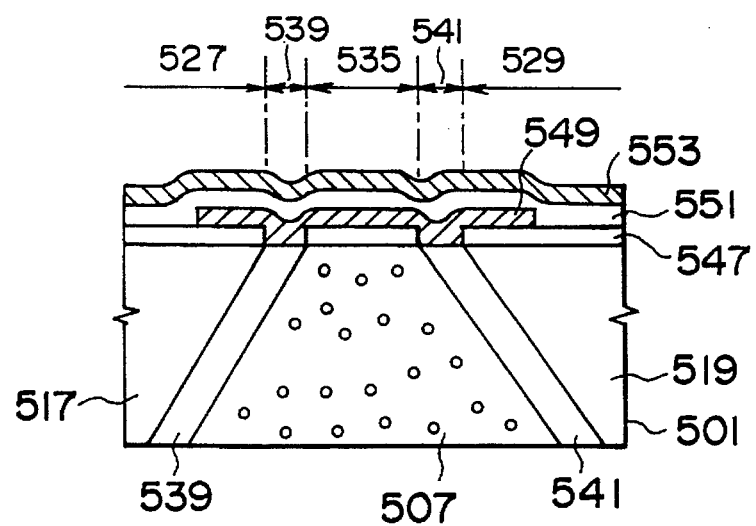
FIG. 5B is a cross-sectional view taken along the line A—A of FIG. 5A.

A dielectric isolation substrate 501 and a field insulating film 547 in FIGS. 5B and 5C are respectively formed in the same way as the first embodiment.

According to the fifth embodiment, a lower metallization 549 is formed on the field insulating film 547 and the exposed portions of first and second isolation insulating film regions 539 and 541. The lower metallization 549 includes a lower metallization portion which is formed on a supporter region 535 between a first element forming region 527 and a second element forming region 529 and extends in the first direction, a first wide portion which is shaped of a triangular prism and extends on the first isolation insulating film region 539 between the first element forming region 527 and the second element forming region 529 and on the first element forming region 527 and a second wide portion which is shaped of a triangular prism and extends on the second isolation insulating film region 541 between the first element forming region 527 and the second element forming region 529 and on the second element forming region 529 (FIG. 5A). That is, the end portion of the first wide portion crosses the first isolation insulating film region 539 between the first element forming region 527 and the second element forming region 529 at an angle θ (0°<θ<90°). The end portion of the second wide portion crosses the second isolation insulating film region 541 between the first element forming region 527 and the second element forming region 529 at an angle θ (0°<θ<90°). The angle θ is preferable to be about 45°.

Successively an interlevel insulating film 551 is formed on the lower metallization 549, a field oxide film 547 and the exposed portions of the first, second, third and fourth isolation insulating film regions 539, 541, 543 and 545 in the same way as the first embodiment.

The upper metallization 553 is formed to extend in the second direction to cross the first direction at fight angles from the first element forming region 527 to the second element forming region 529 while striding over the first and second wide portions.

According to the fifth embodiment, the lower metallization 549 is structured to include the first wide portion which crosses the first isolation insulating film region 539 between the first element forming region 527 and the second element forming region 529 at the angle θ (0°<θ<90°) and the second wide portion which crosses the second isolation insulating film region 541 between the first element forming region 527 and the second element forming region 529 at the angle θ (0°<θ<90°) and the upper metallization 553 is structured to stride over the first and the second wide portions.

In this case, there is a possibility that the upper metallization 553 is broken as explained with reference to FIG. 3B in the third embodiment at crossing portions 560, 570, 580 and 590 where the first and the second isolation insulating regions 539 and 541 cross the side surface of the first or second wide portion and the neighboring portions thereof. However, since the upper metallization 553 is formed to stride over the first and second wide portions which cover the second steps S2 as explained in the first embodiment (FIGS. 1F and 1G) at the portion except the crossing portions 560, 570, 580 and 590 is illustrated in FIG. 5B. Accordingly, it is possible to prevent the occurrence of the electromigration if the width of the upper metallization 553 is large.

What is claimed is:

1. A semiconductor device comprising:

a dielectric isolation substrate including a polysilicon supporter layer having first, second, third and fourth cavities and a flat surface thereof, and having a first supporter region extending between the first and second cavities and the third and fourth cavities, and a second supporter region extending between the first and third cavities and the second and fourth cavities, and first, second, third and fourth isolation films formed on the first, second, third and fourth cavities respectively, and first, second, third and fourth single-crystal silicon islands formed on said first, second, third and fourth isolation films respectively so that said first, second, third and fourth single-crystal silicon islands are electrically isolated from said polysilicon supporter layer by said first, second, third and fourth isolation films, and edge surfaces of said first, second, third and fourth isolation films surround said first, second, third and fourth single-crystal silicon islands;

first, second, third and fourth insulating films formed on said first, second, third and fourth single-crystal silicon islands respectively, said first, second, third and fourth insulating films having surfaces being higher than the edge surfaces of said first, second, third and fourth isolation insulating films;

a fifth insulating film formed on the flat surface of said polysilicon supporter layer, said fifth insulating film having a surface being higher than the edge surfaces of said first, second, third and fourth isolation films so that first, second, third and fourth grooves are respectively formed over the edge surface of said first, second, third and fourth isolation films;

a lower conductive layer formed on the fifth insulating film on the second supporter region;

a sixth insulating film formed on said lower conductive layer; and an upper conductive layer formed over said third, fourth and fifth insulting films, said upper conductive layer formed over said third, fourth and fifth insulating films, said upper conductive layer extending from said third insulating film to said fifth insulating film on the first supporter region and further extending over the lower conductive layer along said fifth insulating film on the first supporter region.

2. A semiconductor device comprising:

a dielectric isolation substrate including:

a polysilicon supporter layer having first and second cavities and a flat surface thereof, first and second isolation films formed on the first and second cavities respectively, and first and second single-crystal silicon islands formed on said first and second isolation films respectively so that said first and second single-crystal silicon islands are electrically isolated from said polysilicon supporter layer by said first and second isolation films, and edge surfaces of said first and second isolation films surround said first and second single-crystal silicon islands;

first and second insulating films formed on said first and second single-crystal silicon islands respectively, said first and second insulating films having surfaces being higher than the edge surfaces of said first and second isolation insulating films;

a third insulating film formed on the flat surface of said polysilicon supporter layer, said third insulating film having a surface being higher than the edge surfaces of said first and second isolation films so that first and second grooves are respectively formed over the edge surface of said first and second isolation films;

a lower conductive layer formed on the first, second and third insulating film extending from the first insulating films to second insulating film;

a fourth insulating film formed over said lower conductive layer; and an upper conductive layer formed over said first, second and third insulating films, said upper conductive layer extending from said first insulating film to said third insulating film, and further extending over said lower conductive layer along the said third insulating film laid on said lower conductive layer, and further extending from said third insulating film to said second insulting film.

3. A semiconductor device comprising:

a dielectric isolation substrate including:

a polysilicon supporter layer having first and second cavities and a flat surface thereof, first and second isolation films formed on the first and second cavities respectively, and first and second single-crystal silicon islands formed on said first and second isolation films respectively so that said first and second single-crystal silicon islands are electrically isolated from said polysilicon supporter layer by said first and second isolation films, and edge surfaces of said first and second isolation films surround said first and second single-crystal silicon islands;

first and second insulating films formed on said first and second single-crystal silicon islands respectively, said first and second insulating films having surfaces being higher than the edge surfaces of said first and second isolation insulating films;

a third insulating film formed on the flat surface of said polysilicon supporter layer, said third insulating film having a surface being higher than the edge surfaces of said first and second isolation films so that first and second grooves are respectively formed over the edge surface of said first and second isolation films;

a lower conductive layer formed on the third insulating film having a portion extending to cross said first or second groove at acute angles, a fourth insulating film formed on said lower conductive layer; and an upper conductive layer formed above said first, second and third insulating films, said upper conductive layer extending from above said first insulating film to above said second insulating film on said fourth insulating film above the portion of said lower conductive layer which crosses said first or second groove.

4. A semiconductor device comprising:

a substrate with a surface having a first cavity, a second cavity, a third cavity and a fourth cavity formed therein and spaced apart to form a rectangular arrangement;

a first isolation film formed on interior surfaces of the first cavity, a second isolation film formed on interior surfaces of the second cavity, a third isolation film formed on interior surfaces of the third cavity, and a fourth isolation film formed on interior surfaces of the fourth cavity, the first, second, third, and fourth isolation films having respective edges which are planar with the surface of the substrate;

a first single-crystal silicon island formed on the first isolation film thereby filling the first cavity, a second single-crystal silicon island formed on the second isolation film thereby filling the second cavity, a third single-crystal silicon island formed on the third isolation film thereby filling the third cavity, and a fourth single-crystal silicon island formed on the fourth isolation film thereby filling the fourth cavity, wherein the first, second, third and fourth single-crystal silicon islands have respective surfaces which are planar with the surface of the respective isolation film edges and planar with the surface of the substrate, and wherein the first, second, third and fourth single-crystal silicon islands are electrically isolated from the substrate;

a first insulating film formed on the surface of first single-crystal silicon island, a second insulating film formed on the surface of second single-crystal silicon island, a third insulating film formed on the surface of third single-crystal silicon island, and a fourth insulating film formed on the surface of fourth single-crystal silicon island, the first, second, third and fourth insulating films having a thickness and thereby having an upper surface in a different plane than the surface of the substrate and the edges of the first, second, third and fourth isolation films;

a fifth insulating film, formed on the surface of the substrate between the first, second, third and fourth cavities, the fifth insulating film having a thickness and thereby having an upper surface in a different plane than the surface of the substrate and the edges of the first, second, third and fourth isolation films, wherein a first groove, a second groove, a third groove and a fourth groove are respectively formed having as lower surfaces thereof the respective edges of the first, second, third and fourth isolation films, the grooves having side walls formed by sides of the fifth insulating film and sides of the first, second, third and fourth insulating films, respectively;

a first conductive layer having a first portion formed on the fifth insulating film and extending between the first and second cavities and between the third and fourth cavities, the first conductive layer having a second portion extending from the third insulating film to the fourth insulating film, the second portion formed on the third insulating film, the third groove, the fifth insulating film, the fourth groove, and the fourth insulating film;

a sixth insulting film formed on the first conductive layer and on portions of the first, second, third and fourth insulating films which are not covered by the first conductive layer; and a second conductive layer formed on the sixth insulating film, and having a first segment which extends parallel to and above the second portion of the first conductive layer separated therefrom by the sixth insulating film, the second conductive layer having second and third segments which extend perpendicular to and above the second portion of the first conductive layer separated therefrom by the sixth insulating film, and the second conductive layer having fourth and fifth segments extending adjacent to one side of opposite end portions of the first segment parallel to the first segment, and in opposite directions away from each other.

* * * * *